United States Patent [19]

Seki

[11] Patent Number: 5,423,283
[45] Date of Patent: Jun. 13, 1995

[54] METHOD FOR GROWING ANTIMONY-DOPED SILICON SINGLE CRYSTAL

[75] Inventor: Hidetoshi Seki, Takasaki, Japan

[73] Assignee: Shin-Etsu Handotai Co., Ltd., Tokyo, Japan

[21] Appl. No.: 613,343

[22] Filed: Nov. 14, 1990

[30] Foreign Application Priority Data

Nov. 24, 1989 [JP] Japan .................................. 1-305091

[51] Int. Cl.⁶ .......................................... C30B 15/04
[52] U.S. Cl. ........................................ 117/19; 117/928
[58] Field of Search .................... 156/618.1, DIG. 89, 156/DIG. 94; 437/971; 117/19, 928

[56] References Cited

U.S. PATENT DOCUMENTS

| | | | |
|---|---|---|---|
| 3,501,406 | 3/1970 | Kappelmeyer . | |
| 4,040,895 | 8/1977 | Patrick et al. | 156/618.1 |
| 4,239,585 | 12/1980 | Kohl | 156/618.1 |
| 4,417,943 | 11/1983 | Jacques et al. . | |
| 4,537,652 | 8/1985 | Kawasaki et al. | 156/DIG. 89 |
| 4,659,421 | 4/1987 | Jewett | 156/DIG. 89 |
| 4,973,377 | 11/1990 | Katsuoka et al. | 156/618.1 |

FOREIGN PATENT DOCUMENTS

| | | |
|---|---|---|
| 0042901 | 1/1982 | European Pat. Off. . |
| 7623756 | 5/1977 | France . |
| 2638303 | 2/1978 | Germany ..................... 156/DIG. 89 |
| 1519725 | 8/1978 | United Kingdom . |

OTHER PUBLICATIONS

Journal of Crystal Growth, vol. 49, No. 2, Jun., 1980, pp. 291–296, Amsterdam, NL; P. Scheel et al.: "Crystal pulling using ACRT".

Primary Examiner—R. Bruce Breneman
Assistant Examiner—Felisa Garrett
Attorney, Agent, or Firm—Jordan and Hamburg

[57] ABSTRACT

A method for growing an antimony-doped silicon single crystal having an oxygen concentration of 12 ppma or more is employed wherein the pressure of an atmospheric inert gas within the furnace is set at a range between 10 and 50 millibars (1000–5000 Pa), and also the reference rate of rotation of the quartz crucible is set at 5 rpm or more while pulling an antimony-doped silicon single crystal having an antimony concentration of $6 \times 10^{18}$ atom/cc or more from an antimony-doped silicon melt contained in a quartz crucible according to the Czochralski process. The reference rate of rotation can be increased in accordance with the increasing length of the pulled single crystal, and further a pulse-like change in rotation rate can be superimposed over the reference rate of rotation, so that the pulled single crystal can have a high and axially and radially uniform oxygen concentration throughout the entire length of the single crystal.

1 Claim, 2 Drawing Sheets

METHOD FOR GROWING ANTIMONY-DOPED SILICON SINGLE CRYSTAL

BACKGROUND OF THE INVENTION

The present invention relates to a method for increasing the oxygen concentration of an antimony-doped silicon single crystal to be used for a low-resistivity substrate for preparing n/n+ type silicon epitaxial wafers, especially of a silicon single crystal heavily doped with antimony which has a resistivity as low as 0.1 ohm centimeter or less.

In recent years, antimony-doped single-crystal silicon substrates have often been used as a n-type substrate for epitaxial wafers which are processed to semiconductor devices. However, the antimony-doped silicon single crystal, especially a low-resistivity silicon single crystal doped heavily with antimony, is too low in oxygen concentration to cause an intrinsic gettering effect. This has been a serious problem for the improvement of performance and yield in preparing semiconductor devices from epitaxial wafers making use of such a single-crystal substrate.

The reason an antimony-doped silicon single crystal has a lower oxygen concentration is considered to be as follows: The reaction between a quartz crucible and a silicon melt causes many volatile silicon oxides (SiOx) to be produced. The silicon oxides form a diffusion layer on the surface of the silicon melt. The silicon oxides are dissolved into the silicon melt in high concentration and collide with antimony atoms and antimony oxides. The collision makes the silicon oxides easily evaporate through the diffusion layer, when a reduced pressure is provided in the space of the furnace. Continuation of this condition causes the oxygen concentration of the silicon melt to be lowered, resulting in lowered oxygen concentration of the pulled single-crystal silicon rod.

The oxygen concentration of the antimony-doped silicon single crystal is preferably in the range of 16 to 22 ppma (parts per million atomic). It was impossible to obtain a silicon single crystal in this concentration range under conventional operating conditions. The pressure within conventional furnaces was at most 15 millibars (1500 Pascals). Consequently, it was impossible to obtain antimony-doped silicon single crystals of 16 ppma or more in oxygen concentration.

In order to prevent antimony from evaporating under reduced pressures inside the furnace, there is a known method wherein the pressure inside the furnace is maintained within the range of 40 to 100 torr, i.e., 53-133 millibars (5300-13300 Pa) (Japanese Patent Laid-Open Publication No. 62-292691). This pressure range surely prevents the evaporation of the antimony from the melt. However, if a silicon single crystal is pulled under this condition, the low segregation coefficient of antimony makes the material in the silicon melt enormously concentrated. The concentration of antimony in the single crystal becomes disadvantageously progressively higher toward the pulling direction of the rod. Further, crystal defects are prone to be generated under this condition with the result that crystallization cannot be successfully progressed during one entire pulling operation cycle.

SUMMARY OF THE INVENTION

The present invention has been made in the light of the deficiencies of conventional technologies as stated above.

It is an object of the present invention to provide a method for growing an antimony-doped silicon single crystal wherein the evaporation of silicon oxides and antimony as well as antimony oxides in an antimony-contained silicon melt is so controlled that the antimony-doped silicon single crystal has an antimony concentration of $6 \times 10^{18}$ atoms/cc or more and the concentration can be made axially uniform while the silicon single crystal can be grown to have a controlled level of oxygen concentration.

In order to realize the above object, according to the present invention, the pressure of the atmospheric gas inside the furnace is set at the range of 10 to 50 millibars (1000–5000 Pa), and also the rotation per minute of the quartz crucible is set at a constant rate or at a rate of rotation continuously changeable with the passage of time (hereinafter to be referred to as a reference rotation), in either case the minimum rate of rotation being at least 5 rpm, so that the concentration level of antimony in the pulled antimony-doped silicon single crystal will be $6 \times 10^{18}$ atoms/cc or more, when an antimony-doped single-crystal silicon rod is pulled from a silicon melt heavily doped with antimony in a quartz crucible in an atmospheric inert gas. For instance, the rotation rate of the quartz crucible is gradually increased with the progress of the pulling. As an alternative, a pulse-like change in rotation rate of the quartz crucible is superimposed over the continuous change in the crucible rotation rate with the passage of time. These changes are realized automatically by programs in conformity with the pulled length or pulling time of the single crystal. For example, a pulse-like change in rotation rate is superimposed over a reference rotation rate. Then, the cycle of the pulse-like change is continuously shortened in conformity with the pulled length of the crystal or with the passage of time of the pulling.

Excessive pressures of the atmospheric inert gas over the upper limit of the set range will bring about an extraordinary concentration of antimony contained in the silicon melt, with the result that the crystallinity of the single crystal will be in disorder. In contrast, pressures below the lower limit promote evaporation of the antimony in the melt so that antimony in the melt is reduced to too small a quantity. As a result, the concentration of antimony in the pulled single crystal fails to reach the level of $6 \times 10^{18}$ atoms/cc. It is also impossible that the pulled single crystal has a resistivity low enough for preparing a single-crystal substrate for epitaxial wafers. Further, when pressures of the atmospheric inert gas are less than the lower limit, the pulled single crystal fails to top the minimum oxygen concentration of 12 ppma which is required for causing an intrinsic gettering effect, even if the rotation rate of the quartz crucible is controlled by superimposing a pulse-like change in rotation rate over a reference rotation rate as stated above.

A reference rotation rate of five rpm of the quartz crucible is enough for the oxygen concentration level of the above-mentioned 12 ppma without the additional superimposition of a pulse-like change in rotation rate. However, the superimposition of a pulse-like change in rotation rate raises the level of oxygen concentration. Either an increase in reference rotation rate according to the pulled length or a pulse-like change in rotation rate superimposed over the reference rotation rate accompanied by the extension of the interval between the pulses according to the pulled length enables the axial oxygen concentration to be uniform with the resultant variation in concentration controlled to under 10%.

A pulse-like change in rotation rate of the quartz crucible superimposed over a reference rotation rate also promotes uniform radial oxygen concentration distribution of the pulled single crystal. The radial variation amounts to 15 to 30% in the absence of a pulse-like change in rotation rate of the quartz crucible, while the superimposition has an effect of reducing the radial variation down to the range of 5 to 10%.

DESCRIPTION OF THE PREFERRED EMBODIMENTS

The present invention will be described by referring to the preferred embodiments as follows:

Embodiment 1

Figure 1:
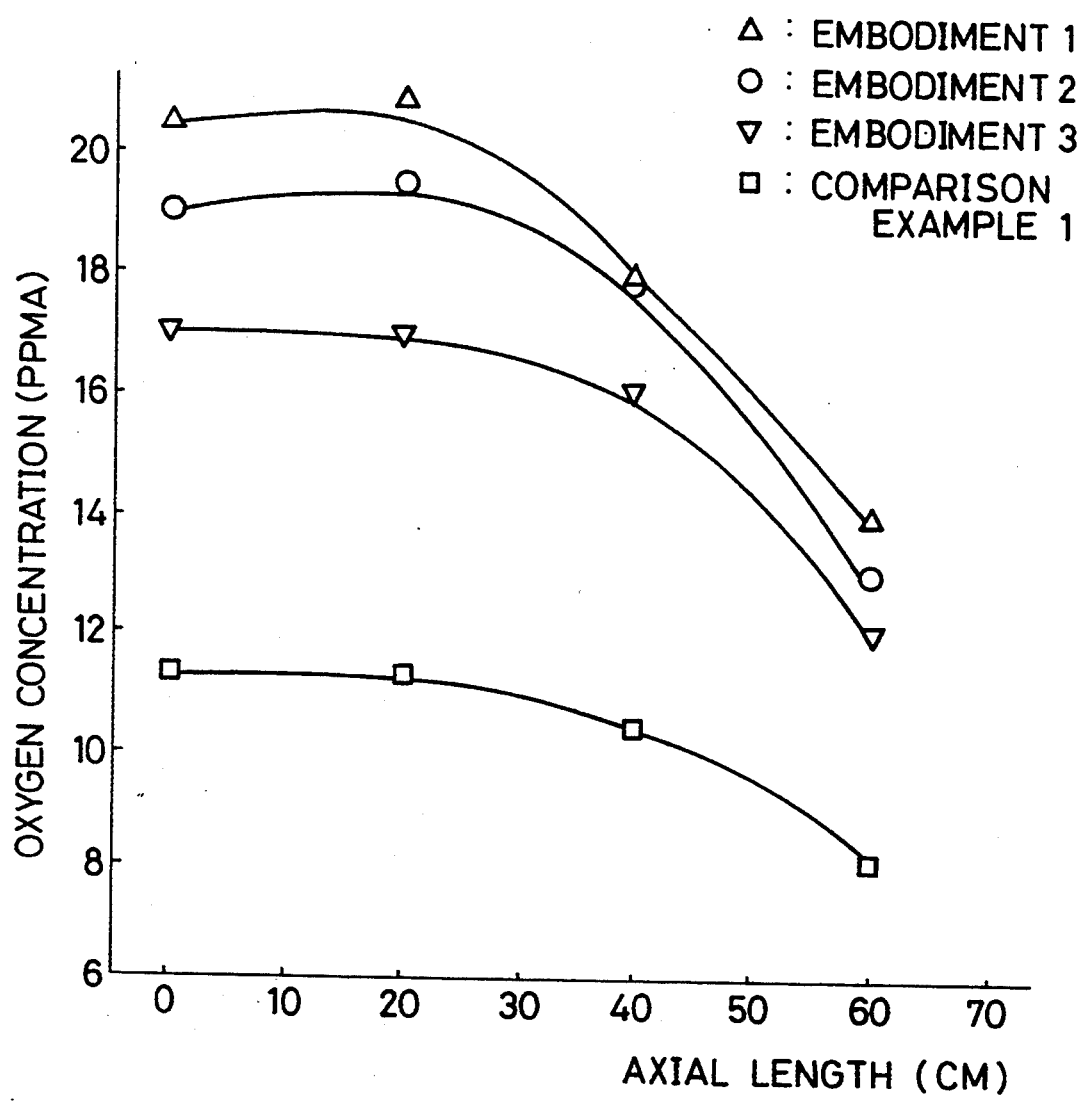
FIG. 1 is a graph showing the oxygen concentration of a single-crystal silicon rod obtained from Embodiments 1 to 3 of the present invention and Comparison Example 1.

Polycrystalline silicon (35 kg in weight) was put into a quartz crucible 14 inches in internal diameter. A main chamber was evacuated to introduce an inert gas (argon) thereinto. The flow rate of the gas at this time was 50 liters per minute. The pressure of the gas was 50 millibars (5000 Pa) and the rotation of the quartz crucible was 5 rpm. The polycrystalline material was melted in the quartz crucible by a heater. Antimony pellets of 200 g were put into the molten silicon. A seed crystal was placed at the lower point of a pulling axle, which was lowered to have the seed crystal become intimate with the silicon melt. Then the axle was slowly raised to obtain a single-crystal silicon rod of 6 inches in diameter and 60 cm in length. The axial oxygen concentration of the single-crystal silicon rod was measured, the result of which is shown in FIG. 1. FIG. 1 shows that the single-crystal rod thus obtained has an oxygen concentration of 12 ppma (the standard adopted by JEIDA—Japan Electronic Industry Development Association) or more throughout the entire length of the rod. This means that an oxygen concentration above the required minimum level was attained.

Embodiment 2

The same operation as Embodiment 1 was carried out except that the pressure inside the main chamber was set at 30 millibars (3000 Pa) to pull a single-crystal silicon rod of the same size as Embodiment 1. The axial oxygen concentration of this single-crystal silicon rod was measured, the result of which is shown in FIG. 1. FIG. 1 shows that the single-crystal silicon rod thus obtained has an oxygen concentration of 12 ppma or more throughout the entire length of the rod. This means that an oxygen concentration above the required minimum level was attained.

Embodiment 3

The same operation as Embodiment 1 was carried out except that the pressure inside the main chamber was set at 15 millibars (1500 Pa) to pull a single-crystal silicon rod of the same size as Embodiment 1. The axial oxygen concentration of this single-crystal silicon rod was measured, the result of which is shown in FIG. 1. FIG. 1 shows that the single-crystal silicon rod thus obtained has an oxygen concentration of 12 ppma or more throughout the entire length of the rod. This means that an oxygen concentration above the required minimum level was attained.

Comparison Example 1

The same operation as Embodiment 1 was carried out except for the pressure within the main chamber was set at 8 millibars (800 Pa), and further the rotation of the quartz crucible was set at 4 rpm to pull a single-crystal silicon rod of the same size as Embodiment 1. The axial oxygen concentration of this single-crystal silicon rod was measured, the result of which is shown in FIG. 1. FIG. 1 shows that the single-crystal silicon rod thus obtained has an oxygen concentration less than 12 ppma. This means that a required oxygen concentration could not be attained.

Embodiment 4

Figure 2:
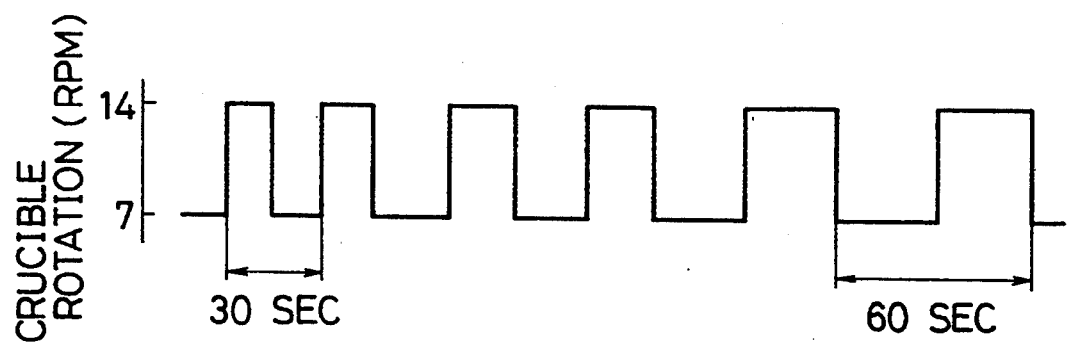
FIG. 2 is a graph schematically showing the change in crucible rotation in Embodiment 4 of the present invention with respect to time as an abscissa.
Figure 3:
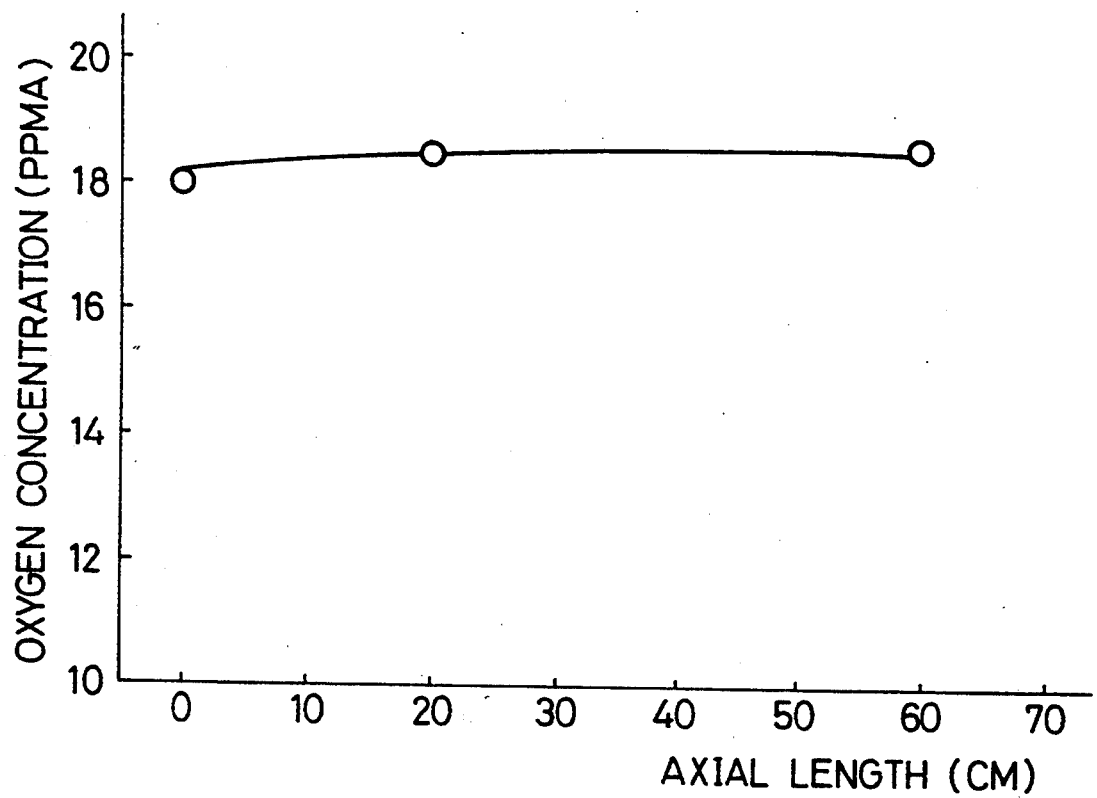
FIG. 3 is a graph showing the axial oxygen concentration of the single-crystal silicon rod obtained from Embodiment 4.

The constant reference rate of rotation of the quartz crucible was 7.0 rpm as shown in FIG. 2. The range of pulse-like change in rotation rate was maintained at 7 rpm (i.e., the higher rate of rotation was 14.0 rpm). The ratio of the period of time of reference rotation/the period of time of higher rotation=1/1. The cycle of pulse-like change in rotation rate of the quartz crucible was maintained: 1) at 30 sec for the length of the silicon single crystal in the pulling process being 0 to 20 cm, 2) at 30 to 60 sec for the length being 20 to 35 cm, and 3) at 60 sec for the length being 35 cm or more. A single-crystal silicon rod of the same size as Embodiment 3 was obtained by the same process as Embodiment 3 except for the rotation rate of the quartz crucible as described above. The axial oxygen concentration of this single-crystal silicon rod was measured, the result of which is shown in FIG. 3. FIG. 3 shows that the single-crystal silicon rod thus obtained has an oxygen concentration of 12 ppma or more throughout the entire length of the rod. This means that an oxygen concentration above the required minimum level was attained.

As stated above, according to the present invention, an effect has been achieved wherein evaporation of the silicon oxides and antimony as well as antimony oxides is adequately controlled so that the oxygen concentration of an antimony-doped silicon single crystal is increased to the required level.

What is claimed is:

1. A method for growing silicon single-crystal heavily doped with antimony according to the Czochralski process, comprising pulling an antimony-doped single-crystal silicon rod from an antimony-doped silicon melt contained in a quartz crucible in an inert gas atmosphere having a pressure ranging from 1000 to 5000 Pascals, rotating said quartz crucible during said pulling at a reference rotation rate of at least 5 rpm, and periodically and cyclically superimposing a pulse increase in rotation rate of said quartz crucible onto said reference rotation rate, each cycle of superimposing said pulse increase in rotation rate of said quartz crucible onto said reference rotation rate including a first duration of time wherein said quartz crucible is rotated at a rate equal to the sum of said reference rotation rate and said pulse increase in rotation rate and a second duration of time wherein said quartz crucible is rotated at said reference rotation rate, and increasing said first duration of time and said second duration of time of said cycles as the length of said silicon single-crystal increases during said pulling, to thereby provide an antimony-doped silicon single-crystal rod having a uniform oxygen content of at least 12 ppma and a uniform antimony content of at least $6 \times 10^{18}$ atoms/cc.

* * * * *